3,126,281

REPRODUCTION LAYERS CONTAINING ORTHO-QUINONE DIAZIDES

Oskar Süs and Karl Möller, Weisbaden-Biebrich, Germany, assignors, by mesne assignments, to Azoplate Corporation, Murray Hill, N.J.

No Drawing. Filed Jan. 27, 1960, Ser. No. 4,889
Claims priority, application Germany Feb. 4, 1959
8 Claims. (Cl. 96—33)

It is known to the art that printing plates, which after being inked with greasy ink can be used for printing, are obtained if a base material, e.g. metal foil or plastic or paper sheet, is coated with a light-sensitive reproduction layer, exposed under a master, and developed.

o-Benzo- and o-naphthoquinone diazide compounds have already been used as light-sensitive substances in the reproduction layers of such printing plates. Also, sulfonic acid esters and carboxylic acid esters and amides of such o-quinone diazides, with various hydroxyl compounds or amines, have been used heretofore.

For developing the exposed layers, acid and alkaline substances, as well as solvents have been proposed.

It is known that, under the influence of heat, o-quinone diazides yield compounds which contain carboxylic groups. If, after exposure to light, such reproduction layers which contain o-quinone diazide compounds are developed with alkaline substances, the light-decomposition products, in the form of their salts, are removed from the base material. Printing plates which correspond to the master are thus obtained. In order to obtain from the masters, negative printing plates, i.e. the tonal values of which are reversed during the developing process, it is known to remove the o-quinone diazide, which was not affected by light, from the base material by the action of developers containing solvents. However, as the light-decomposition products are also soluble in solvents, although to a smaller extent, the time of development and the quantity of the solvent used as a developer must be carefully selected.

Negative printing plates have also been produced by using o-quinone diazides containing basic groups and treating the exposed reproduction layers with acid developers. In this case, difficulties will arise, as the light-decomposition products are, to a minor degree, also soluble in acidic developing liquids.

Now, reproduction layers for negative printing plates have been found which contain o-quinone diazides and which are characterized in that they contain at least one solid aromatic compound containing at least one free primary amino group.

As o-quinone diazides, compounds can be used which very widely differ in their constitution. The most important feature is the presence of the light-sensitive o-quinone diazide configuration in an aromatic compound. Especially suitable are compounds of the benzene-, diphenyl-, naphthalene- or dinaphthyl series, carrying one or more o-quinone diazide groupings, such as o-benzoquinone diazide, naphthoquinone-(1,2)-diazide-(1), naphthoquinone-(1,2)-diazide-(2), 7-methoxy-naphtho-quinone-(1,2)-diazide-(2), 6-methylnaphthoquinone-(1,2)-diazide-(2), 6-chloronaphthoquinone-(1,2)-diazide-(2), 7-chloro-naphthoquinone-(1,2)-diazide-(2), 6-nitro-naphthoquinone-(1,2)-diazide-(2), 5-(carboxy-methyl)-naphthoquinone-(1,2)-diazide-(1), diphenyl-bis-quinone-(3,3′,4,4′)-diazide-(4,4′), phenanthrenequinone-(2,3)-diazide-(2), phenanthrenequinone diazide-(9,10), and chrysenequinone-(3,4)-diazide-(3).

Advantageously, those compounds having aromatic nuclei can be used which, in addition to the o-quinone diazide grouping, contain sulfonic acid- or carboxylic groups which have been reacted with primary or secondary aliphatic or aromatic amines, preferably primary aromatic amines, to form amides, or which have been reacted with aliphatic or aromatic hydroxyl compounds to form esters. The following compounds are especially suitable:

benzoquinone-(1,2)-diazide-(2)-sulfanilide-(4),
3-methylbenzoquinone-(1,2)-diazide-(1)-sulfanilide-(5),
naphthoquinone-(1,2)-diazide-(1)-carboxylic acid-(6),
naphthoquinone-(1,2)-diazide-(1)-carboxylic acid anilide-(6),
naphthoquinone-(1,2)-diazide-(2)-carboxylic acid amide-(3),
naphthoquinone-(1,2)-diazide-(2)-carboxylic acid anilide-(3),
naphthoquinone-(1,2)-diazide-(2)-sulfanilide-(5),
naphthoquinone-(1,2)-diazide-(2)-sulfanilide-(4),
N,N-bis-(naphthoquinone-(1,2)-diazide-(2)-sulfonyl-(5))-aniline,
2′-(naphthoquinone-(1,2)-diazide-(2)-sulfonyl-amino-(5))-diphenylether,
naphthoquinone-(1,2)-diazide-(2)-sulfonic acid ethyl ester-(5),
bis-(naphthoquinone-(1,2)-diazide-(2)-sulfonic acid-(5))-diphenyl-diester-(4′,4″),
bis-(naphthoquinone-(1,2)-diazide-(2)-sulfonic acid-(5))-dinaphthylmethane-(1′,1″)-diester-(2′,2″), and
tetra-(naphthoquinone-(1,2)-diazide-(2)-sulfonic acid-(5))-diphenyl-tetra-ester-(2′,2″,4′,4″).

As solid, aromatic compounds with at least one free, primary amino group, those amines are particularly suitable which carry at least one benzene- or naphthalene nucleus. Compounds having a melting point of above about 80° C. are preferred, because reproduction layers produced therewith, possess increased storageability. The following compounds are given as examples: 4,4′-diamino-diphenyl, 4,4′-diamino-diphenyl-methane, 4,4′-diamino-benzophenone, 1,4-diamino-benzene, 4,4′-diamino-3,3′-dimethoxy-diphenyl, 2-amino-stilbene, 4-amino-stilbene, 4,4′-diamino-stilbene, 4,4′-diamino-diphenyl-sulfone, 4,4′-diamino-diphenylamine, 1-amino-naphthalene, 2-amino-naphthalene, 1,4-diamino-naphthalene, 1,5-diamino-naphthalene, 2,6-diamino-naphthalene, 2,7-diamino-naphthalene, 2-amino-chrysene, and 2-amino-fluorene.

Low-polymeric aromatic compounds containing amino groups have proved to be of particular advantage, e.g. aminostyrene compounds, such as pentameric 4-amino-styrene.

The action of the amines within the reproduction layer is due to the fact that, during the light-decomposition of the o-quinone diazides in the presence of amines, acid amides are directly formed which have a relatively high molecular weight and very poor solubility. Printing plates having such reproduction layers are rendered particularly suitable for the negative reproduction of masters. The light-decomposition products which are formed with reproduction layers according to the present invention have such a low degree of solubility that, although acid and alkaline developers as well as developer solutions containing solvents can be used, sharp negative reproductions are obtained. As during the light decomposition process according to the present invention, an enlargement of the molecules takes place, o-quinone diazides containing no additional ester or amide groups can be successfully used which, because of their relatively simple constitution, can be easily prepared.

The molar proportions of the primary aromatic solid amines to the o-quinone diazides are such that at least one amino group is present for at least one of the o-quinone diazide groups.

For applying the reproduction layers onto the base material, one or more o-quinone diazide compounds and one or more primary solid aromatic amines are dissolved in one or more suitable solvents, such as ketones, alcohols, alcoholic ethers, dioxane or dimethyl formamide, preferably those boiling at temperatures ranging from about 80° C. up to about 150° C. This solution is applied to the base material, mounted, e.g., on a rotating disc, and subsequently the solvent is dried by means of an air current, if necessary at higher temperatures. In order to obtain the best possible adhesion of the layer to the support, thorough drying is necessary. The thus coated supports can be exposed under a master and subsequently developed in the usual manner. The unexposed parts of the reproduction layer are thus removed and the base material is laid bare whereby a negative printing plate of the master is obtained. After inking with greasy ink, reproductions can be produced from these printing plates.

The o-quinone diazides used together with the primary aromatic solid amines are prepared by known procedures. The following literature references describe processes for the production of the exemplary compounds listed below:

FORMULA 1

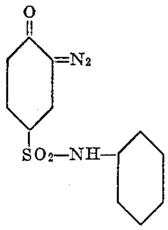

FORMULA 2

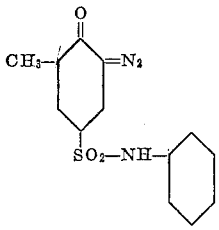

FORMULA 3

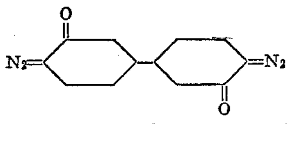

FORMULA 4

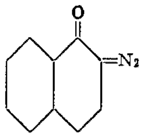

FORMULA 5

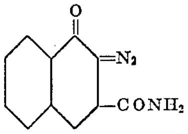

FORMULA 6

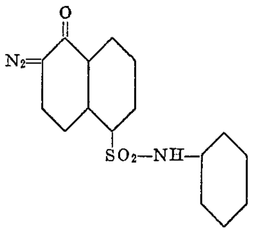

FORMULA 7

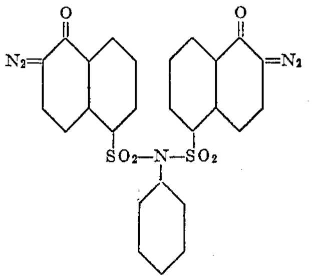

FORMULA 8

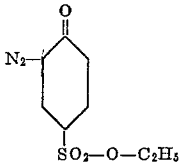

FORMULA 9

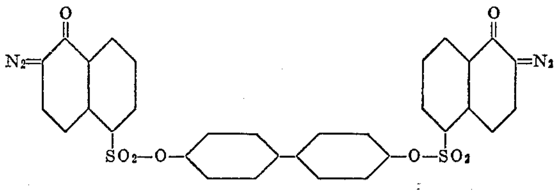

FORMULA 10

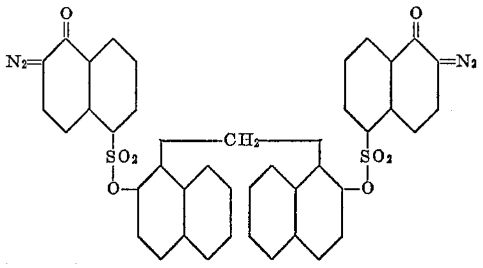

FORMULA 11

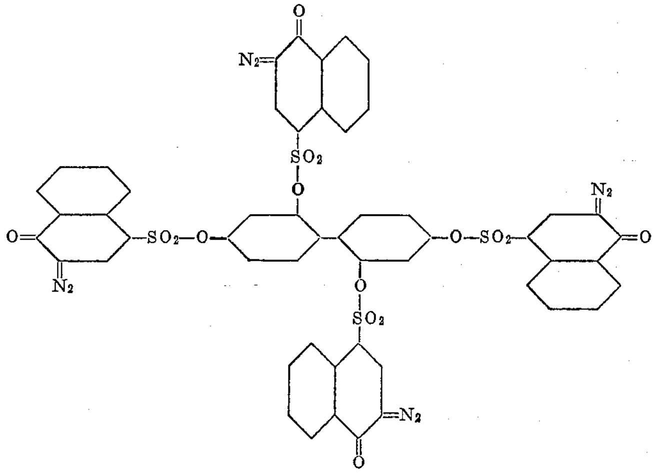

FORMULA 12

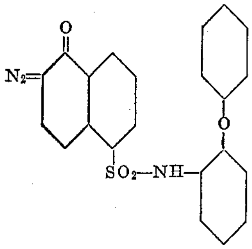

Formulae 1 and 2: Preparation is analogous to the method described in German Patent No. 888,204. Benzoxazolone-sulfonic acid chloride-(5) is condensed with aniline, the oxazolone ring is split up by boiling in aqueous sodium hydroxide solution, and the resulting compound is then diazotized in a hydrochloric acid solution.

Formula 3: See "J. Chem. Soc.," London, 1929, page 151.

Formula 4: See "J. prak. Chem." (2), volume 105, 1923.

Formula 5: The compound corresponding to formula 5 is prepared by introducing naphthoquinone-(1,2)-diazide-(2)-carboxylic acid chloride-(3), the preparation of which is described in German Patent 957,392, in a 25% aqueous ammonia solution; the compound forms yellow, tangled needles.

Formula 6: See "Liebigs Ann. d. Chem.," volume 579, page 151 (1953).

Formula 7: See "Lieb. Ann. d. Chem.," volume 579, page 154 (1953).

Formula 8: See German Patent 865,410.

Formula 9: The compound is prepared analogously to similar compounds the preparation of which is described in German Patent 865,109. 1 mole of 4,4'-dihydroxy-diphenyl is condensed with 2 moles of naphthoquinone-(1,2)-diazide-(2) sulfonic acid chloride-(5), the compound having the form of yellow crystals.

Formula 10: The compound corresponding to Formula 10 is prepared analogously to the compound corresponding to Formula 9. 1 mole of 2,2'-dihydroxy-1,1'-dinaphthylmethane is condensed with 2 moles of naphthoquinone-(1,2)-diazide-(2)-sulfonic acid chloride-(3).

Formula 11: Preparation is analogous to Example 2.

Formula 12: Preparation is analogous to that of the compound corresponding to Formula 6. 1 mole of 2-amino-diphenylether is condensed with 1 mole of naphthoquinone-(1,2)-diazide-(2)-sulfonic acid chloride-(5).

The invention will be further illustrated by reference to the following specific examples:

*Example 1*

2.2 parts by weight of benzoquinone-(1,2)-diazide-(2)-sulfanilide-(4), corresponding to Formula 1, and 0.96 part by weight of pentameric 4-aminostyrene (M. Martinoff, Bull. Soc. Chim. France (1955), 376) are dissolved in 25 parts by volume of dimethyl formamide and the solution is diluted with 75 parts by volume of ethyleneglycol monomethylether. The solution is applied to a mechanically roughened aluminum plate mounted on a rotating disc and the coated plate is then dried by means of a current of warm air to remove the solvent. Subsequently, the sensitized plate is exposed for about 90 seconds under a master to the light of, e.g., an 18 amp. arc lamp at a distance of about 70 cm. For development of the latent image thus produced, the exposed layer is treated with a cotton pad soaked in 1.5–2% phosphoric acid; an image becomes clearly visible against a metallic background. After inking with greasy ink, the foil may be used as a printing plate. As the tonal values are reversed during the developing step, negative printing plates are obtained from the master.

The following o-quinone-diazide-aminostyrene combinations may also be used in the above process: 2.9 parts by weight of 3-methyl-benzoquinone-(1,2)-diazide-(1)-sulfanilide-(5) (Formula 2), or 1.2 parts by weight of bis-o-quinone-diazide from 3,3'-dihydroxy-4,4'-diamino-diphenyl (Formula 3), or 2.93 parts by weight of naphthoquinone-(1,2)-diazide-(2)-sulfanilide-(5) (Formula 6), in each case together with 1.2 parts by weight of pentameric 4-amino-styrene, or 1.12 parts by weight of naphthoquinone-(1,2)-diazide-(2)-sulfonic acid-(5)-ethyl-ester (Formula 8), together with 0.48 part by weight of pentameric 4-amino-styrene.

If, for the production of the light-sensitive layer, there are used either 1.36 parts by weight of naphthoquinone-(1,2)-diazide-(2), corresponding to Formula 4, with 0.96 part by weight of pentameric 4-aminostyrene, or 0.84 part by weight of naphthoquinone-(1,2)-diazide-(2)-carboxylic acid-amide-(3), corresponding to Formula 5, with 0.48 part by weight of pentameric 4-aminostyrene, the images produced by the influence of light can be developed even with a 0.25 percent phosphoric acid solution.

*Example 2*

A superficially roughened aluminum foil is coated with a solution containing 2.88 parts by weight of the compound obtained by esterification of 1 mole 2,2',4,4'-tetrahydroxy-diphenyl and 4 moles of naphthoquinone-(1,2)-diazide-(2)-sulfonic acid-(4) (Formula 11) and 0.99 part by weight of 4,4'-diamino-diphenyl-methane dissolved in a mixture of 30 parts by volume of dimethyl-formamide and 70 parts by volume of ethyleneglycol monomethylether. After drying, the sensitized foil is exposed under a master as described in Example 1. For developing the latent image thus produced, the exposed layer is treated with a 1.5–2 percent phosphoric acid solution. After inking the developed layer with greasy ink, a printing plate is obtained which is negative with regard to the master used. Very long runs are obtained.

Instead of 0.99 part by weight of 4,4′-diamino-diphenyl-methane there may be used 1.4 parts by weight of β-naphthyl-amine or 1.4 parts by weight of α-naphthyl-amine for the preparation of the sensitizing solution.

The compound corresponding to Formula 11 is prepared as follows:

Into a solution containing 10 parts by weight of 2,2′,4,4′-tetrahydroxy-diphenyl and 50 parts by weight of naphthoquinone-(1,2)-diazide-(2)-sulfonic acid chloride-(4) dissolved in 640 parts by volume of dioxane there is introduced, over a period of 3 hours and with mechanical agitation, a solution of 16 parts by weight of sodium bicarbonate in 400 parts by volume of water. Subsequently, 30 parts by volume of a 10 percent sodium bicarbonate solution are added and the reaction mixture is further agitated for 3–4 hours. The reaction mixture is left standing for one night and the fluid is separated from the reaction product, which has precipitated in the form of a sticky, resinous mass. The reaction product is then agitated with 1000 parts by volume of an about 50 percent alcohol solution whereupon it breaks down into a reddish-brown powder. For purification, the precipitate is separated by suction and dissolved in 300 parts by volume of dioxane, the solution is decolorized with animal charcoal, and the reaction product is reprecipitated from the filtrate, while vigorously agitating mechanically, by adding drop-wise 500 parts by volume of alcohol. The compound thus obtained is a tannin-colored powder which, upon heating in a melting-point tube, spontaneously decomposes at a temperature of 160–165° C.

*Example 3*

An aluminum foil, one side of which had been roughened by brushing is coated, on its brushed side, with a solution of 2.38 parts by weight of naphthoquinone-(1,2)-diazide-(2)-sulfanilide-(5), corresponding to Formula 6, and 0.79 part by weight of 4,4′-diamino-diphenylmethane in 100 parts by volume of ethyleneglycol monomethylether. After exposure of the dried sensitized foil under a transparent master, the negative image of the master thus produced is developed by treatment with 1.5–2 percent phosphoric acid and then inked with greasy ink. A printing plate is thus obtained which cannot be rubbed off. Instead of dilute phosphoric acid, a mixture of 75 parts by volume of water and 25 parts by volume of 96 percent alcohol may be used for developing the image produced on the exposed foil.

If paper masters are used, e.g. masters produced from originals printed on both sides by way of a reflex process, the sensitized foil has to be exposed for about 5–6 minutes because of the poorer light-permeability of the master.

Anodically oxidized aluminum foils may be used with similar success as supports for the light-sensitive layer. For development of the images produced on such foils, there may be used either a 1.5–2 percent phosphoric acid solution or a gum arabic solution containing alcohol which is prepared by dissolving 7.8 parts by weight of gum arabic in 52.2 parts by weight of water and diluting this solution by adding 32 parts by weight of 96 percent alcohol. If the alcoholic developer solution is used, it is advisable to thoroughly rinse the developed image with water and briefly treat it with about 0.5 percent phosphoric acid to improve its hydrophilic properties, before it is inked with greasy ink.

Printing plates produced on anodically oxidized alumium are distinguished by their resistance to mechanical stress in printing machines. They are, therefore, especially suited for very long runs.

*Example 4*

An aluminum foil which had been superficially roughened by sand-blasting is sensitized by coating it with a solution of 2.38 parts by weight of naphthoquinone-(1,2)-diazide-(2)-sulfanilide-(5) (Formula 6) and 0.72 part by weight of benzidine in 100 parts by volume of ethyleneglycol monomethylether. After drying, the sensitized foil is exposed under a master. Development of the latent image thus produced is effected by treatment of the exposed layer with the aqueous alcoholic gum arabic solution described in Example 3. For completion of the printing plate the developed layer is thoroughly rinsed with water, briefly treated with an about 0.5 percent phosphoric acid solution, and inked with greasy ink. A negative printing plate is obtained from the master.

*Example 5*

A commercially available paper foil produced by S. D. Warren Company, Cumberland Mills, Maine, U.S.A., for use as a layer support for negative working reproduction material is coated with a solution of 2.93 parts by weight of naphthoquinone-(1,2)-diazide-(2)-sulfanilide-(5) (Formula 6) and 1.2 parts by weight of pentameric 4-aminostyrene in a solvent mixture, made up of 25 parts by volume of dimethyl formamide and 75 parts by volume of ethyleneglycol monomethylether, and subsequently dried by means of hot air. The negative image produced on the layer by exposure under a master is developed by treatment with a developer containing water, gum arabic, phosphoric acid, and tetrahydronaphthalene. For working up the printing plates the developed foil is rinsed with water, briefly wiped over with 0.25 percent phosphoric acid, and inked with greasy ink. Instead of the paper foil there may be used superficially roughened or anodically oxidized aluminum foils, with equally good results being obtained.

The above mentioned developer is prepared by dissolving 7.8 parts by weight of gum arabic in 52.2 parts by weight of water, acidifying the solution by adding 0.5 part by weight of an about 85 percent phosphoric acid and diluting it with 40 parts by weight of tetrahydronaphthalene. Before use, the developer must be thoroughly shaken.

*Example 6*

A solution containing 2.24 parts by weight of N,N-bis-(naphthoquinone-(1,2)-diazide-(2)-sulfonyloxy-(5))-anilide (Formula 7) and 0.84 part by weight of 4,4′-diaminobenzophenone dissolved in a solvent mixture made up of 25 parts by volume of dimethyl formamide and 75 parts by volume of ethyleneglycol monomethylether is used for sensitizing an aluminum foil both surfaces of which had been brushed. After exposing the foil under a master for about 5–6 minutes, the latent image thus produced is developed using the alcohol-water-gum arabic mixture described in Example 3. The foil is then made ready for printing according to the procedure of Example 3.

If a transparent master is used, an exposure of about 90 seconds is sufficient. A negative printing plate is obtained.

If the 4,4′-diamino-benzophenone used above is replaced by 4,4′-diamino-diphenyl mehane (0.79 part by weight) or β-naphthylamine (1.16 parts by weight), development of the image, which is a negative of the master used, and processing of the printing plate are effected by analogy to the procedure of Example 5.

*Example 7*

A zinc foil which had been cleaned by brushing it with a 4 percent acetic acid solution containing about 4 parts by weight of potash alum, is coated with a solution of 2.24 parts by weight of N,N-bis-(naphthoquinone-(1,2)-diazide-(2)-sulfonyloxy-(5))-anilide (Formula 7) and 0.96 part by weight of pentameric 4-aminostyrene in a solvent mixture made up of 25 parts by volume of dimethyl formamide and 75 parts by volume of ethyleneglycol monomethylether. After drying, the foil is exposed under a master, as usual, and the latent image thus produced is developed with a developer fluid containing 35 parts by weight of water, 5 parts by weight of gum arabic, 59.7 parts by weight of tetrahydronaphthalene and 0.3 part by weight of phosphoric acid. Further treatment of the foil to produce a negative printing plate includes rinsing with water, a brief treatment with a cotton pad soaked in about 0.25 percent phosphoric acid, and inking with greasy ink.

*Example 8*

A superficially roughened aluminum foil is sensitized by coating it with a solution containing, in 25 parts by volume of dimethyl formamide and 75 parts by volume of ethyleneglycol monomethylether, 0.48 part by weight of 4,4'-diamino-diphenyl-methane and 1.91 parts by weight of the diester from 2,2'-dihydroxy-1,1'-dinaphthylmethane and naphthoquinone-(1,2)-diazide-(2)-sulfonic acid-(5) (Formula 10). An image is produced on the light-sensitive layer by exposing it for 90 seconds under a master and this image is developed by treating the exposed layer with a solution containing 53.3 parts by weight of ethyleneglycol monomethylether, 35 parts by weight of water and 5 parts by weight of gum arabic. Completion of the negative printing plate is effected analogously to the procedure of Example 7.

Equally good results are obtained if a solution is used containing 2.6 parts by weight of the diester from 4,4'-dihydroxy - diphenyl and naphthoquinone-(1,2)-diazide-(2)-sulfonic acid-(5) (Formula 9) and 0.96 part by weight of pentameric 4-aminostyrene.

*Example 9*

A superficially roughened aluminum foil is sensitized as usual with a solution containing 1.68 parts by weight of the sulfonamide of naphthoquinone-(1,2)-diazide-(2)-sulfonic acid-(5) and 2-amino-diphenylether (Formula 12) and 0.39 part by weight of 4,4'-diamino-diphenylmethane dissolved in a mixture of 25 parts by volume of dimethyl-formamide and 75 parts by volume of ethyleneglycol monomethylether. After drying, the sensitized foil is exposed under a master as described in Example 1. For developing the latent image, produced by the influence of light, a 0.25–0.5 percent trisodium phosphate solution is used. After rinsing with water and briefly etching with about 0.25 percent phosphoric acid, the negative image may be inked with greasy ink.

Similarly, the compound corresponding to Formula 6, the naphthoquinone - (1,2) - diazide-(2)-sulfanilide-(5) (2.38 parts by weight) may be used in combination with 4,4'-diamino-diphenylmethane (0.79 part by weight) in the sensitizing solution.

It will be obvious to those skilled in the art that many modifications may be made within the scope of the present invention without departing from the spirit thereof, and the invention includes all such modifications.

What is claimed is:

1. A presensitized printing plate comprising a base material having a coating thereon comprising an orthoquinone diazide compound and, in admixture therewith, a solid aromatic primary amine in proportions such that at least one amino group is present for at least one of the orthoquinone diazide groups, the amine upon exposure of the plate to light reacting to form an acid amide having a relatively high molecular weight and a low degree of solubility in a developer solution.

2. A presensitized printing plate according to claim 1 in which the diazide compound is substituted by a member of the group consisting of sulfonyloxy, sulfonylamino, carbonyloxy and carbonylamino.

3. A presensitized printing plate according to claim 1 in which the solid aromatic primary amine contains at least two benzene rings.

4. A presensitized printing plate according to claim 1 in which the solid aromatic primary amine is pentameric 4-amino styrene.

5. A process for developing a printing plate which comprises exposing a supported light-sensitive layer to light under a master, the layer comprising an orthoquinone diazide compound and, in admixture therewith, a solid aromatic primary amine in proportions such that at least one amino group is present for at least one of the orthoquinone diazide groups, the amine upon exposure of the plate to light reacting to form an acid amide having a relatively high molecular weight and a low degree of solubility in a developer solution, and removing the layer in those areas not affected by the light by treatment of the layer with a developer solution.

6. A process according to claim 5 in which the diazide compound is substituted by a member of the group consisting of sulfonyloxy, sulfonylamino, carbonyloxy and carbonylamino.

7. A process according to claim 5 in which the solid aromatic primary amine contains at least two benzene rings.

8. A process according to claim 5 in which the solid aromatic primary amine is pentameric 4-amino styrene.

References Cited in the file of this patent

UNITED STATES PATENTS

| | | |
|---|---|---|
| 2,702,243 | Schmidt | Feb. 15, 1955 |
| 2,794,388 | Lake et al. | June 4, 1957 |
| 3,007,795 | Haydn | Nov. 7, 1961 |

FOREIGN PATENTS

| | | |
|---|---|---|
| 596,731 | Germany | May 9, 1934 |
| 699,412 | Great Britain | Nov. 4, 1953 |
| 706,028 | Great Britain | Mar. 24, 1954 |
| 706,879 | Great Britain | Apr. 7, 1954 |

OTHER REFERENCES

Sanders: The Aromatic Diazo Compounds, Edward Arnold & Co., London, 1949, pages 200–205 (copy in Division 60).

Gortner et al.: Outlines of Biochemistry, Wiley, New York, and Chapman and Hall, London, 1953, page 390.

Merck Index, Student Edition, sixth edition, Merck & Co., Rahway, N.J., 1952, page 454.

Conant et al.: The Chemistry of Organic Compounds, 4th ed., The MacMillan Co., New York, 1952, pages 347 and 365; copy in Sci. Lib.

Beilstein: Organische Chemie, Band 14, Julius Springer, Berlin, 1931, pages 494, 497 and 498.